(12) United States Patent
Economy et al.

(10) Patent No.: US 11,646,206 B2
(45) Date of Patent: *May 9, 2023

(54) METHODS OF FORMING TUNGSTEN STRUCTURES

(71) Applicant: Micron Technology, Inc., Boise, ID (US)

(72) Inventors: David Ross Economy, Boise, ID (US); Brian Beatty, Portland, OR (US); John Mark Meldrim, Boise, ID (US); Yongjun Jeff Hu, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 133 days.

This patent is subject to a terminal disclaimer.

(21) Appl. No.: 17/101,950

(22) Filed: Nov. 23, 2020

(65) Prior Publication Data

US 2021/0183651 A1   Jun. 17, 2021

Related U.S. Application Data

(63) Continuation of application No. 16/235,765, filed on Dec. 28, 2018, now Pat. No. 10,847,367.

(51) Int. Cl.
*H01L 21/02* (2006.01)
*C23C 16/28* (2006.01)
*C01G 41/00* (2006.01)

(52) U.S. Cl.
CPC ........ *H01L 21/02645* (2013.01); *C01G 41/00* (2013.01); *C23C 16/28* (2013.01); *H01L 21/0257* (2013.01); *C01P 2006/40* (2013.01)

(58) Field of Classification Search
None
See application file for complete search history.

(56) References Cited

U.S. PATENT DOCUMENTS

| | | | |
|---|---|---|---|
| 6,110,826 | A | 8/2000 | Lou et al. |
| 6,245,654 | B1 | 6/2001 | Shih et al. |
| 6,310,300 | B1 | 10/2001 | Cooney, III et al. |
| 6,579,788 | B1 | 6/2003 | Jones et al. |

(Continued)

FOREIGN PATENT DOCUMENTS

| | | |
|---|---|---|
| CN | 105917446 A | 8/2016 |
| CN | 113130387 A | 7/2021 |

(Continued)

OTHER PUBLICATIONS

"European Application Serial No. 19901716.1, Response Filed Feb. 21, 2022 to Communication pursuant to Rules 161(2) and 162 EPC dated Aug. 11, 2021", 12 pgs.

(Continued)

*Primary Examiner* — Asok K Sarkar
(74) *Attorney, Agent, or Firm* — Schwegman Lundberg & Woessner, P.A.

(57) ABSTRACT

Described are methods for forming a multilayer conductive structure for semiconductor devices. A seed layer is formed comprising a metal and an additional constituent that in combination with the metal inhibits nucleation of a fill layer of the metal formed over the seed layer. Tungsten may be doped or alloyed with silicon to form the seed layer, with a tungsten fill being formed over the seed layer.

20 Claims, 4 Drawing Sheets

(56) References Cited

U.S. PATENT DOCUMENTS

| | | |
|---|---|---|
| 6,734,097 B2 | 5/2004 | Iggulden et al. |
| 7,666,785 B2 | 2/2010 | Sung et al. |
| 7,830,016 B2 | 11/2010 | Meldrim et al. |
| 10,847,367 B2 * | 11/2020 | Economy ............... C23C 16/28 |
| 11,244,903 B2 | 2/2022 | Greenlee et al. |
| 2002/0048938 A1 | 4/2002 | Ishizuka et al. |
| 2006/0063025 A1 | 3/2006 | Huang et al. |
| 2008/0089111 A1 | 4/2008 | Lee et al. |
| 2008/0237798 A1 | 10/2008 | Lee et al. |
| 2008/0247214 A1 | 10/2008 | Ufert |
| 2008/0248327 A1 | 10/2008 | Huang et al. |
| 2009/0142925 A1 | 6/2009 | Ha et al. |
| 2009/0321943 A1 | 12/2009 | Meldrim et al. |
| 2012/0181707 A1 | 7/2012 | Xiao et al. |
| 2014/0154883 A1 | 6/2014 | Humayun et al. |
| 2014/0167131 A1 | 6/2014 | Lu et al. |
| 2015/0008505 A1 | 1/2015 | Chien et al. |
| 2015/0171321 A1 | 6/2015 | Chan et al. |
| 2016/0149002 A1 | 5/2016 | Sharangpani et al. |
| 2016/0233220 A1 | 8/2016 | Danek et al. |
| 2018/0076032 A1 | 3/2018 | Wang et al. |
| 2019/0051661 A1 | 2/2019 | Carlson |
| 2020/0211843 A1 | 7/2020 | Economy et al. |
| 2021/0202388 A1 | 7/2021 | Greenlee et al. |
| 2022/0230962 A1 | 7/2022 | Greenlee et al. |
| 2022/0310524 A1 | 9/2022 | Greenlee et al. |
| 2022/0310525 A1 | 9/2022 | Greenlee et al. |

FOREIGN PATENT DOCUMENTS

| | | |
|---|---|---|
| CN | 113454770 A | 9/2021 |
| CN | 115148704 A | 10/2022 |
| EP | 1094504 A2 | 4/2001 |
| JP | 2007324560 A | 12/2007 |
| JP | 2010261103 A | 11/2010 |
| JP | 2011014667 A | 1/2011 |
| KR | 100705936 B1 | 4/2007 |
| KR | 20170028872 A | 3/2017 |
| WO | WO-0104949 A1 | 1/2001 |
| WO | WO-2016085572 A1 | 6/2016 |
| WO | WO-2020139632 A1 | 7/2020 |
| WO | WO-2022212035 A1 | 10/2022 |

OTHER PUBLICATIONS

"Chinese Application Serial No. 202011499891.1, Office Action dated Apr. 15, 2022", W/ English Translation, 12 pgs.

"International Application Serial No. PCT/US2022/020361, International Search Report dated Jul. 1, 2022", 3 pgs.

"International Application Serial No. PCT/US2022/020361, Written Opinion dated Jul. 1, 2022", 5 pgs.

"International Application Serial No. PCT/US2019/066919, International Preliminary Report on Patentability dated Jul. 8, 2021", 9 pgs.

"International Application Serial No. PCT/US2019/066919, International Search Report dated Apr. 22, 2020", 3 pgs.

"International Application Serial No. PCT/US2019/066919, Written Opinion dated Apr. 22, 2020", 6 pgs.

"Chinese Application Serial No. 202011499891.1, Response filed Aug. 26, 2022 to Office Action dated Apr. 15, 2022", with English claims, 15 pages.

"European Application Serial No. 19901716.1, Extended European Search Report dated Aug. 29, 2022", 6 pgs.

"Japanese Application Serial No. 2021-537802, Notification of Reasons for Rejection dated Nov. 1, 2022", with English translation, 15 pages.

* cited by examiner

METHODS OF FORMING TUNGSTEN STRUCTURES

PRIORITY APPLICATION

This application is a continuation of U.S. application Ser. No. 16/235,765, filed Dec. 28, 2018, which is incorporated herein by reference in its entirety.

TECHNICAL FIELD

Embodiments described herein relate generally to manufacturing of tungsten structures of microelectronic devices, such as tungsten structures on a semiconductor die; and more particularly relate both to methods of forming such tungsten structures during manufacture of such microelectronic devices, for example during processing of semiconductor wafers, and the resulting devices.

BACKGROUND

Microelectronic devices permeate every aspect of daily life. A continuous demand exists for miniaturization and reduction of power requirements, but also for increased processing power and speed. With these competing demands, the complexity and density of the underlying circuitry grows, along with the complexity of manufacturing processes to form such circuitry. As the density of structures forming such circuitry increases, with the result of the dimensions of individual conductive structures shrinking, manufacturing conductive structures with acceptable electrical properties becomes increasingly challenging.

Examples of such microelectronic devices include semiconductor structures (such as semiconductor devices formed on a semiconductor substrate (termed "semiconductor die")), as well as circuit components and interconnections that may be formed over interposers and/or other non-semiconductor substrates. Semiconductor structures include semiconductor, dielectric, and conductive elements, all patterned to form circuit components and desired interconnections between the circuit components. The conductive structures are often formed from one or more metals or metal-containing materials. However, the resistance of conventionally formed conductive structures generally increases as the critical dimensions of the conductive structures are reduced, potentially complicating the manufacture of semiconductor structures with necessary electrical properties. As a result, conventionally formed conductive structures may require larger than desired line widths to maintain suitable electrical properties (such as an acceptably low resistance), for operation of the device; or may require use of exotic materials and/or processing methods to form suitable structures.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As the critical dimension of conductive structures using conventional materials in semiconductor devices decreases, e.g. reaching 20 nm and below, however, the resistance of the conventionally-formed conductive materials typically increases. In some applications, in which longer conductor lengths are desired, at reduced critical dimensions, the increased resistance may preclude the use of otherwise preferred conductive materials. The increasing resistance thus impacts device design and may cause more exotic materials or processing methods to be used, or new complex device designs to be designed and implemented, to diminish the effects from the reduced dimensions.

The present disclosure addresses various embodiments for forming conductive structures of tungsten in a manner to offer improved conductivity relative to conventionally formed tungsten structures. In the described example processes, tungsten is deposited through use of a seed material. The seed material includes both tungsten and another material in a composition to facilitate formation of a fill material of desired properties over the seed material. The inventors have identified that a relatively low resistance tungsten structure may be formed if at least a majority portion (50% or more) of the tungsten is in the alpha state (as discussed later herein), and if a majority of the tungsten exhibits large grain size. For example, a desired physical property of the tungsten fill material may be that a majority of the tungsten fill material exhibits a grain size (as determined by a longest dimension the grains), of about 20 nm or greater; and for many examples, a grain size in the range of about 30-50 nm will be desirable. The term "about" herein is meant to include a variance of ±10% to provide for variances of manufacturing processes, measuring techniques, etc.

As a result, the additional material in the seed material will be selected to inhibit nucleation of subsequently formed tungsten fill material when formed on the seed layer, thereby promoting formation of such relatively large grained tungsten as described above. The nucleation-inhibiting properties need not exist as to such material alone, but need be present in the seed layer when the tungsten fill is formed over the seed layer. In some examples, this additional nucleation-inhibiting material may be present as a dopant of the metal; while in other examples, the nucleation-inhibiting material may be alloyed with the tungsten. In some embodiments, the composition of the seed material, and the inhibition of nucleation of the tungsten fill material (the fill material forming the bulk of the conductive structure), will also result in a majority of the tungsten fill material being formed of larger grains (e.g., in some examples, within the range of 30-50 nm). For some examples, the tungsten fill material having grains having a longest dimension in excess of 20 nm may form at least about 70% of the tungsten fill material. In other examples, tungsten fill material having grains with a longest dimension in excess of 20 nm may offer beneficial electrical properties if present in only about fifth % of the tungsten fill material.

For purposes of the present description, the term "seed layer" is used to describe the forming of a structure having both a metal and a nucleation-inhibiting material. The term "seed layer" does not imply any form in which either material is formed (i.e., the materials may be deposited in a form other than what persons skilled in the art might consider a "layer," and the two constituent materials may be deposited simultaneously, or sequentially; and use of the term "layer" does not imply any degree of uniformity, or of contiguous coverage of an underlying support structure on which is formed). For example, the seed layer may, or may not be deposited as a film (for example having a dimension of 10 nm or less); and may not necessarily cover the entirety of a support surface over which the tungsten fill will be formed.

In the described examples, the seed layer includes tungsten, with silicon present to inhibit nucleation of a subsequent tungsten fill; and may be formed on a supporting surface of the substrate over which the conductive tungsten structure will be formed. In some examples such seed layer may include silicon present in a range of 4% to 28% by atomic weight.

As discussed in more detail below, the supporting surface can be of various materials and configurations. One example configuration that may be used is one in which the supporting surface is a surface defining, at least in part, a recess in a structure. For example, the supporting surface may be defined, at least in part, by a dielectric layer. In some examples, the recess may be a trench through which an elongated conductive line is to be formed.

One example application in which elongated conductive traces are used is in memory arrays. In memory arrays, conductive lines such as word lines and bit lines typically extend across substantial portions (or all) of the memory array. While tungsten has often been a preferred material for at least some of these lines, use of conventionally deposited tungsten can yield less than optimal electrical characteristics in structures of reduced dimensions; for example, in structures in which the critical dimension of the tungsten structures is 100 nm or less.

Microelectronic devices can include multiple structures potentially benefiting from relatively low resistance tungsten conductive lines, including structures on a semiconductor die itself, as well as on package substrates, interposers, redistribution layers, etc. For purposes of the present disclosure, the term "substrate" will be used to identify any structure for inclusion in a microelectronic device on which the described tungsten structures will be formed (which may be, for example, a semiconductor wafer, an individual semiconductor die, interposers, etc. (as discussed above); while the term "semiconductor device substrate" is used to specifically identify the structures present at any of the multiple stages of forming a semiconductor die on a semiconductor wafer or on an analogous semiconductor structure. Any or all such structures may benefit from the formation of relatively low resistance tungsten structures therein.

Figure 1:
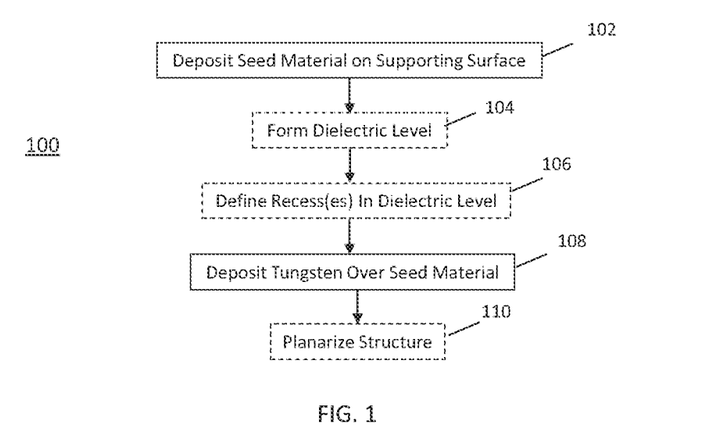
FIG. 1 is a block diagram illustrating an example process for manufacturing a substrate (such as, for example, a semiconductor die substrate) having tungsten conductive structures in accordance with the present description.

FIG. 1 depicts a flow chart of an example process for producing a conductive tungsten structure over a substrate. For purposes of the examples herein, the substrate is described in the context of a semiconductor device substrate (for example, a substrate of a semiconductor die). As a result, the substrate semiconductor material (termed herein, a "wafer") may be, for example, Si, Ge, or a compound semiconductor such as SiC, SiGe, a III-V semiconductor (e.g., GaAs or InP or ternary/quaternary semiconductors), or other semiconductor materials known to persons skilled in the art). One illustrative embodiment of the various examples above is forming a tungsten structure on a supporting surface of a semiconductor die substrate.

As indicated at 102, process 100 includes forming a seed layer on a supporting surface. In many examples, the seed layer will include tungsten, and in embodiments discussed herein will further include silicon. Forming the seed layer on the supporting surface may optionally include forming of the supporting surface of a desired configuration and material. For example, process 100 may include optional operations, 104 and 106, (indicated by dashed lines within the flowchart), which may be used in forming the supporting surface in preparation for the seed layer. As indicated at 104, a dielectric level may be formed over, for example, a semiconductor substrate. The term "level" is used herein to identify the presence of a structure which may be a single material, or multiple materials. For example, the dielectric level may be formed of a single dielectric material or of multiple dielectric materials. As indicated at 104, a recess may be formed in the dielectric level. In some embodiments, the recess (for example, a trench or via) will define a path in which the tungsten will be formed. Such recesses may, in some embodiments, be etched from an upper surface of the dielectric level into the dielectric level. The recesses may be formed, in some example implementations, of about 50-200 nm in depth and may be of about 10 nm to 40 nm in width. Other implementations may include recesses, shallower or deeper, and/or narrower or wider. Accordingly, the identified dimensions are examples only.

As will be discussed further in reference to FIGS. 2A-2E, in some examples the dielectric level may include first and second vertically disposed (or upper and lower/underlying) dielectric materials. In some such examples, the upper dielectric material (204, 202 in FIGS. 2A-E) may be, for example, silicon oxide (SiO), and the underlying dielectric material (202 in FIGS. 2A-E) may be different, for example, silicon nitride (SiN). In some examples, the upper dielectric material may have a vertical dimension of about 50-200 nm. In the depicted example, recesses (206 in FIGS. 2A-E) are formed through the upper dielectric level, such that upper dielectric defines the sidewalls of the recesses, and lower dielectric defines the bottom surface of the recesses, the recesses may be formed through a photolithographic process as known to persons skilled in the art, which may include depositing a photoresist over the upper dielectric level 204, patterning the photoresist using a mask, removing either the unexposed or exposed portions of the photoresist, etching the exposed portion of the upper dielectric level 204 via wet or dry chemical etching, for example, and removing the remaining photoresist after formation of the recesses by ashing, for example.

Thus, in embodiments in which the recesses extend within a dielectric material, the dielectric material may include one or more grown or deposited insulative materials. In addition to SiN or SiO, mentioned above, the recesses may be formed in other types of nitrides and/or oxides. In the latter case, for example, the recesses may extend into a high-K dielectric, for example a high-K oxide (for example, zirconium or hafnium oxide) rather than, or in addition to, SiO.

In forming the seed layer, as indicated at 102, the seed layer may be formed on one or more dielectric levels (or other material levels) formed above the substrate, and in many examples will be may be formed at least in part in recesses extending through one or more dielectric levels. In other embodiments, the seed layer may be formed in a structure (such as a trench) formed within the semiconductor substrate material itself (and in most such embodiments, lined with a dielectric film to isolate the seed layer and other conductive structures to be formed from the semiconductor substrate material).

In some examples, the seed layer can be in the form of a thin layer (in some examples, having a thickness of approximately 5-10 nm). As noted previously, the seed layer may be contiguous or non-contiguous over at least some portion of a supporting surface. In some examples, the supporting surface may be a patterned material, for example, either a pattered region of the substrate, or of another material formed over the substrate (such as to form recesses, as discussed above).

In some examples, the recesses may be formed in one material, and then lined with another material (for example, through a conformal coating), prior to deposition of the seed layer. For example, a recess may be formed in a first dielectric material, for example a nitride (SiN) or an oxide (SiO), and then lined on one or all surfaces with another dielectric material before forming of the seed layer.

The seed layer may be deposited via any of the techniques above, for example, plasma vapor deposition (PVD). PVD may desirably be used to form the seed layer in many implementations due to the lower temperature and enhanced controllability of composition and film thickness compared to CVD, which usually operates a high temperature of between about 300° C. and 900° C., and which would thus increase the complexity of the deposition process for the seed layer. The lower processing temperatures associated with PVD can be beneficial to establishing some percentage of beta phase tungsten in the seed layer, which is believed to be beneficial in inhibiting nucleation of the subsequent tungsten fill material.

Tungsten, whether in a seed layer or the later-formed tungsten fill, may be at least in part in either alpha or beta phase. Alpha phase tungsten is a cubic crystalline structure that has a space group of Im-3m (body centered Bravais lattice with 3m symmetry elements) and 2 atoms/unit per cell. Beta phase tungsten is a cubic crystalline structure that has a space group of Pm-3n (primitive with 3n symmetry elements) having 8 atoms/unit per cell. Alpha phase tungsten is desirable to use in structures such as those above due to the lower resistance compared to beta phase tungsten. Additionally, relatively larger crystals of alpha phase tungsten exhibit further reduced resistivity.

The ratio of alpha phase tungsten to beta phase tungsten in the tungsten fill is dependent on the deposition conditions and the underlying layer on which the tungsten is deposited (in the present examples the seed layer). The same considerations also impact avoiding higher resistance amorphous phase tungsten in the tungsten fill. The inventors have identified that beta phase tungsten in the seed layer inhibits nucleation of a tungsten fill material formed on the seed layer, and in doing so promotes formation of relatively larger crystals of alpha phase tungsten than would be formed in the absence of the beta phase tungsten. Beta phase tungsten is relatively unstable, and creation of a seed layer with operationally significant amounts of beta phase tungsten is assisted by forming the seed layer by a method not requiring high temperatures and/or pressures (such as PVD).

To establish beta phase tungsten in the seed layer, and to increase the grain size of the later-deposited conductive material on the seed layer, the seed layer may include a doped or alloyed material. For purposes of the description herein, the seed layer will include both tungsten and silicon (Si), in which the silicon may be present either as a dopant or an alloy. Doping, as used herein, is the intentional introduction of impurities into the base material to modulate the properties of the base material. Doping may occur at the time of deposition, or after the tungsten has been deposited.

In such examples using a seed layer including tungsten and silicon, the tungsten may be a mixture of alpha and beta phase tungsten, ranging from about 10-60% beta phase tungsten by atomic weight, which in many cases will vary in response to the silicon percentage in the seed layer. In some examples, the creation of beta phase tungsten through use of a silicon-doped tungsten seed layer will beneficially include about 4% to about 28% Si by atomic weight. In some implementations, a Si percentage greater than about 28% may cause the seed layer to be at least partially in an amorphous phase, rather than a crystalline phase; and/or may result in the tungsten fill material deposited thereon to be predominantly higher resistance beta phase tungsten and lacking the desired larger grain sizes.

As noted above, the use of a containing tungsten seed layer also enables the use of room temperature PVD to form the seed layer rather than higher temperature processes such as CVD. The use of PVD also permits the formation of the seed layer directly on an underlying dielectric level, if desired, without the use of intermediate layers therebetween. In some embodiments, the seed layer may be formed in a trench formed within an oxide layer, wherein an underlying dielectric level forms the bottom of the recess, and may be, for example, a nitride level. In other embodiments, CVD and ALD processing may be used, if desired, to deposit the seed layer.

Certain dopants/impurities or alloying elements may help to stabilize the beta phase of the material. The structure of the containing tungsten seed layer is less dependent on temperature than a tungsten seed layer. Experiments performed on containing tungsten indicate that at the above doping levels, the tungsten was able to withstand thermal processing of up to about 400° C. (a typical temperature for CVD processes) for up to 30 minutes without substantial alteration of its characteristics (such as would affect the fill material).

To obtain the desired composition for the PVD process, one or more targets may be used to co-deposit the tungsten and silicon. For example, a pure tungsten target may be used in combination with a pure Si target to deposit the seed layer. In such examples, the deposition from both the pure silicon target and the other target may be controlled to arrive at the desired composition. In other embodiments, a single target, such as composite WSix, may be used to result in the desired composition of the seed layer. The composite target may be formed from powdered raw materials and the W/Si ratio may be adjusted by varying the W, Si, and/or $WSi_2$ powder content.

In other examples, the seed layer may be formed by PVD of tungsten alone, and subsequently doped with silicon, such as by silicon implantation techniques known to persons skilled in the art. In yet other examples, as noted above, the tungsten and silicon may each be deposited by atomic layer deposition (ALD) to form layers of tungsten and silicon distributed in a desired ratio.

After deposition of the seed layer at 102, the process may continue by deposition of the tungsten fill layer over the seed layer at operation 108. For example, when recesses are formed, the seed layer is formed, at least partially in the recesses and the recesses may be filled by the tungsten fill material.

As identified above, the tungsten fill material may be predominantly (50% or greater, by atomic weight) alpha phase tungsten with grains having a grain size of least about 20 nm, and for many applications within the range of about 30-50 nm) in the recess, and otherwise being constrained by the width of the recesses. For the avoidance of doubt, the grain size referred to herein is the longest dimension (i.e. length) of grains within the tungsten fill material, at least within a selected region. In contrast, the grain size of tungsten fill material deposited over conventional titanium nitride (TiN) seed layer or without the silicon-containing tungsten seed layer is about 6-15 nm.

The relatively lower resistance of the alpha phase tungsten is enhanced with a larger grain size, as discussed above, as compared with tungsten fill material as would be formed in the absence of the doped or alloyed seed layer. While the silicon-containing tungsten seed layer itself has relatively increased resistance due to its mixed alpha and beta phase composition, this additional resistance is more than compensated for by the lower resistance of the larger grain size, alpha phase tungsten fill, which forms the majority of the conductive structure. The resistance of such tungsten fill material in the recesses is thus relatively low (about 2-4 Ω/sq for about a 20 nm wide deposition that is 65-100 nm in depth) compared with alpha phase tungsten fill typically deposited without the seed layer (>5 Ω/sq for a similar structure) under similar conditions.

In an example in which the recesses are formed, the deposition of the tungsten over the seed material includes depositing the tungsten within at least some portion of the recesses defined at optional operation 104. In many examples, the recesses may be completely filled with the tungsten fill after deposition of the silicon-containing tungsten seed layer. In some embodiments, the entire surface of the support structure defining the recess may be covered by the silicon-containing tungsten seed layer.

The silicon-containing tungsten seed layer may be deposited, as above, using a PVD process, while the tungsten fill layer may be deposed by a CVD process. As above, the silicon-containing tungsten seed layer may help to stabilize the tungsten fill during formation to essentially eliminate the formation of beta phase tungsten, which is more favorable to form at higher temperatures in the absence of the silicon-containing tungsten seed layer. CVD deposition may be used for depositing the tungsten fill material rather than PVD for cost and speed reasons, as well as for controllability due to the less stringent process requirements to form the thicker CVD-deposited tungsten fill material than the seed layer. The CVD process used to deposit the tungsten fill material in the recesses (and on the support surfaces in which the recesses are formed) may be run at a temperature of 200-500° C. or more specifically between about 375° C. and 425° C. The CVD process may use a high-power long-throw plasma of about 4-40 kW for about 10-100 s. The chamber pressure for bulk CVD deposition of tungsten to increase the tungsten grain size may be in a range of about between 0.1 Torr and 300 Torr, or in many examples, between about 30 Torr and 50 Torr.

The CVD process may comprise a variety of processes such as bulk deposition, diborane ($B_2H_6$) based nucleation and/or silane ($SiH_4$) based nucleation for example. The CVD process may include bulk deposition or pulsed nucleation. A diborane ($B_2H_6$) nucleation cycle for the CVD deposition process includes a diborane ($B_2H_6$) soak, tungsten fluoride ($WF_6$) dose followed by [$B_2H_6$/$WF_6$] pulses. Such a nucleation cycle may be repeated in a range of 1 to 20 times or between 1 and 4 times. Conditions for a silane ($SiH_4$) based nucleation cycle for the CVD tungsten process includes a silane ($SiH_4$) soak, tungsten fluoride ($WF_6$) dose followed by [$SiH_4$/$WF_6$] pulses. This nucleation cycle may be repeated in a range of 1 to 20 times or more particularly between 3 and 5 times. In some embodiments, a diborane or silane nucleation temperature range may be between about 250° C. and 350° C., with the chamber temperature and pressure ranges mirroring the above.

After deposition of the tungsten over the seed layer, as discussed relative to 108, optional further processing may occur. For example, as shown at optional operation 110 (again indicated by dashed lines), the resulting structure may be planarized. One manner of planarization may include a chemical-mechanical polishing (CMP) process. Such planarization can be utilized to remove extra tungsten stack materials (such as where such materials extend over a surface of a dielectric, rather than only in recesses within the dielectric); and can also be used to establish a planar surface upon which additional material levels and other structures may be formed.

As an alternative optional operation, once the tungsten fill has been formed, a portion of the supporting surface may be removed. For example, oxide defining the sides of recesses in which the tungsten fill is formed may be etched to define gaps extending between the formed tungsten lines, as a dielectric region between the formed tungsten conductors. Such gaps may be air gaps, or may have another gas therein.

In some embodiments, contact may be made to the tungsten fill through vias formed in material levels extending over the tungsten. For example, if one or more other dielectric materials (and perhaps additional metal layers) are fabricated over the structure containing the tungsten conductors, contacts to the tungsten may be formed subsequently through the layers via a photolithographic process similar to that discussed above.

Figure 2A:
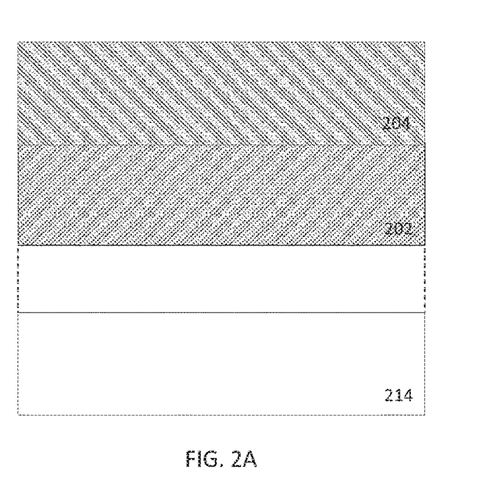
FIGS. 2A-2E illustrate simplified cross-sectional representations of a representative portion of an example semiconductor die incorporating tungsten conductive structures during sequential stages of an example processing flow.

FIGS. 2A-2E depict simplified, cross-sectional representations of representative portions of a semiconductor die during representative stages of forming a tungsten structure of the semiconductor device. FIGS. 2A-2E depict such stages as may be used in accordance with an example process such as that discussed relative to process operations 102-110 of process 100, wherein tungsten structures are formed within recesses in a dielectric. Such tungsten structures may be formed to serve as conductive structures of a memory device, for example, a memory device wordline, bitline, source line, and/or other interconnect features for the memory device; or, alternatively, for conductive structures of logic or high frequency devices. In FIG. 2A, the structure 200 may comprise a dielectric level 202. The dielectric level 202 may be formed on a substrate 214 or on other layers above the substrate 214, as indicated above. Structure 200 is represented in the example of a section of a semiconductor die of a memory device, in which the recesses 206, formed in FIG. 2B, may be considered a cross-sectional representation of a trench that will contain a conductive line extending across a substantial portion of a memory array in a memory device. As depicted, not all recesses will have the same dimensions, depending upon length and function of the conductive structures that will be formed therein (and the depictions are not to scale).

The dielectric level may be formed from a nitride, such as SiN. Another dielectric level 204 may be formed on the underlying dielectric level 202. The top dielectric level 204 may be, for example, an oxide. The oxide layer 204 may be formed from oxide materials such as, aluminum oxide or silicon oxide.

Figure 2B:
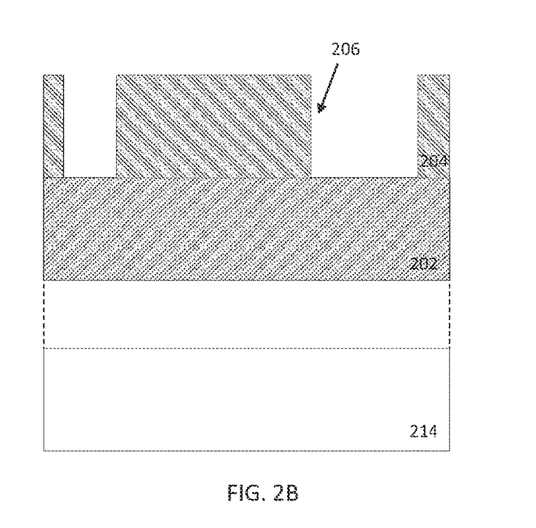

In FIG. 2B, recesses 206 are etched in the oxide dielectric level 204, terminating at the nitride dielectric level 202. The recesses 206 may be formed by a photolithographic process. In some embodiments, a photoresist may be disposed on the oxide dielectric level 204. A mask may be placed over the photoresist and the photoresist may be patterned by exposing a portion of the photoresist to UV radiation. Either the exposed or unexposed portion of the photoresist may be removed, depending on whether the photoresist is positive or negative. Once the desired portion of the photoresist is removed, the underlying oxide dielectric level 204 may be removed by wet chemical or dry plasma/laser etching. The etching to form the recesses 206 may terminate at the surface of the nitride dielectric level 202. After etching the recesses 206, the remaining photoresist may be removed by ashing.

FIG. 2B shows the structure after removing the remaining photoresist. In some bitline applications, the recesses 206 may be about 20 nm wide and 50-100 nm in depth (e.g., the thickness of the oxide layer 204), such as about 80 nm in depth.

Figure 2C:
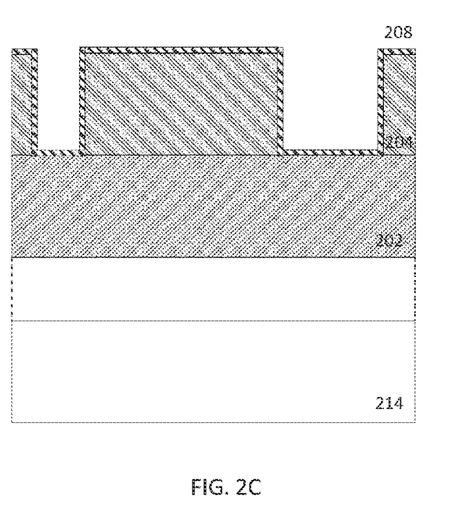

In FIG. 2C, a seed layer 208 may be deposited on the structure after formation of the recesses 206. In some embodiments, the seed layer 208 may be in contact with the periphery of the oxide dielectric level 204 and nitride dielectric level 202 in the recesses 206. In some embodiments, the seed layer 208 may have a thickness less than about 10 nm. As noted previously, the seed layer 208 composition may be selected to increase the grain size in a tungsten fill material deposited on the seed layer to inhibit nucleation of the fill in the recesses 206, as discussed above in reference to FIG. 1.

Figure 2D:
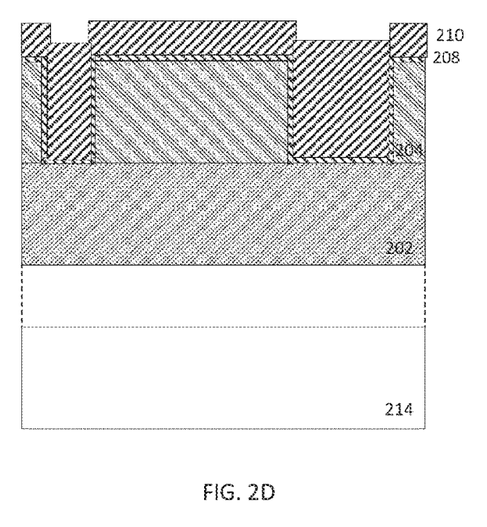

In FIG. 2D, a tungsten fill material 210 may be deposited on the seed layer in the recesses 206. The tungsten fill material 210 may be deposited over the seed layer 208 using CVD. The seed layer 208 may enable a CVD tungsten layer 210 to be formed in which the grain size is increased compared with the grain size if no seed layer 208 had been deposited. The increased grain size may result in a reduction in resistivity, enabling smaller dimensions of conductive structures (e.g., smaller width and/or depth).

In some embodiments, the seed layer 208 may be the only structure disposed between the oxide dielectric level 208 and the tungsten fill material 210. In other embodiments, one or more intervening layers may be formed between the silicon containing tungsten film and the oxide dielectric level 204. Such intervening layers may comprise a variety of materials such as tungsten nitride or tantalum nitride, or additional other dielectric materials.

Note that although tungsten is discussed herein, in some embodiments, other metals or alloys may be used instead or in addition to tungsten, and other materials may be used to inhibit nucleation in the fill material. For example, Ge, Sb, C, N, O or S may be used to inhibit nucleation and thereby promote relatively increased grain size in the fill material. The atomic percentage of these materials in tungsten or other metals may vary depending on the metal and/or dopant.

Figure 2E:
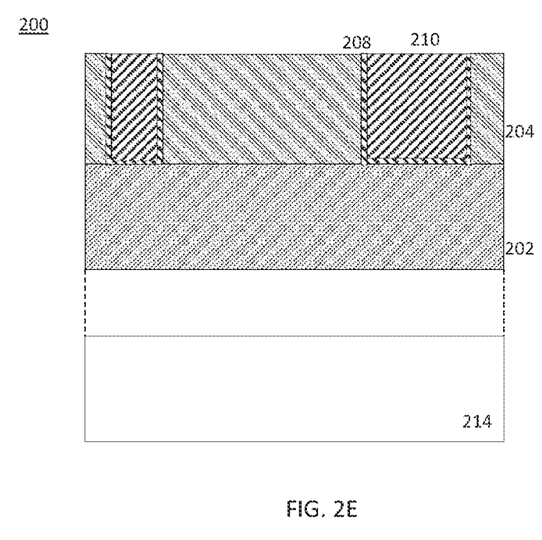

After the tungsten fill material 210 has been deposited, the structure may be planarized, as shown in FIG. 2E. In some embodiments, both the seed layer 208 and the tungsten fill material 210 may be removed from locations outside the recesses 206. CMP or another planarization technique may be used to remove the layers. In some embodiments, the resulting conductive structures (recesses filled with the seed layer 208 and the tungsten fill material 210) may be electrically isolated by the oxide dielectric level 204. The resulting structure 200 may be used in assembly of a variety of devices, such as a memory device word line, a bit line, NAND gates and/or other interconnect features for memory logic, or other types of devices. As above, the recesses may extend along a length of the memory device to form the word lines and/or bit lines. In some embodiments, a thin low-k dielectric that results in a low capacitance may be formed between the film and the underlying oxide.

Although the seed layer has been described as deposited in one or more recesses through a dielectric level, the recess may extend through one or more layers that may include insulating and/or metal layers. Alternatively, the seed layer may be deposited on a dielectric level without recesses and the bulk CVD tungsten deposited on the seed layer to create the large grain bulk tungsten layer.

To further clarify the described subject matter, the following individual Examples are included.

Example 1 is a method of forming a multilayer structure, the method comprising: forming a recess in a dielectric level; forming a seed layer comprising tungsten and silicon in the recess; and forming a tungsten fill over the seed layer, wherein a majority of the tungsten of the tungsten fill has grains having a longest dimension of at least 20 nm.

In Example 2, the subject matter of Example 1 optionally includes 4-28% by atomic weight of the seed layer.

In Example 3, the subject matter of any one or more of Examples 1-2 wherein tungsten of the seed layer comprises both alpha and beta phase tungsten.

In Example 4, the subject matter of Example 3 optionally includes 10-60% beta phase tungsten by atomic weight.

In Example 5, the subject matter of any one or more of Examples 1-4 wherein the seed layer contacts both the dielectric level and the tungsten fill in the recess.

In Example 6, the subject matter of any one or more of Examples 1-5 wherein forming the seed layer comprises doping the tungsten with silicon to form a silicon-doped tungsten seed layer.

In Example 7, the subject matter of any one or more of Examples 1-6 wherein forming the seed layer comprises depositing silicon and tungsten simultaneously.

In Example 8, the subject matter of any one or more of Examples 1-7 wherein the majority of the tungsten in the tungsten fill is alpha phase tungsten and has a grain size having a longest dimension between 30 and 50 nm.

In Example 9, the subject matter of any one or more of Examples 1-8 optionally include performing high temperature processing after deposition of the silicon-doped tungsten seed layer.

In Example 10, the subject matter of any one or more of Examples 8-9 wherein forming the seed layer comprises depositing tungsten by physical vapor deposition (PVD).

In Example 11, the subject matter of any one or more of Examples 9-10 wherein the tungsten fill is deposited by chemical vapor deposition (CVD).

Example 12 is a multilayer structure, the multilayer structure comprising: a first dielectric level; a second dielectric level disposed on the first dielectric level, the second dielectric level comprising recesses formed therein, at least some of the recesses extending to the first dielectric level; a seed layer comprising tungsten and silicon disposed in the recesses and contacting both the first dielectric and the second dielectric level in the recesses; and a tungsten fill disposed on the seed layer and filling the recesses in which the seed layer is present, the majority of the tungsten in the tungsten fill having grains with a maximum dimension of at least about 30-50 nm.

In Example 13, the subject matter of Example 12 wherein an amount of the silicon in the seed layer is between about 4-28% by atomic weight.

In Example 14, the subject matter of Example 13 optionally includes 10-60% beta phase tungsten by atomic weight.

In Example 15, the subject matter of any one or more of Examples 13-14 includes at least 40% alpha phase tungsten and has a grain size with a maximum dimension between 30 and 50 nm.

In Example 16, the subject matter of any one or more of Examples 13-15 wherein a resistivity of the seed layer is higher than that of the alpha phase tungsten and a resistivity of a combination of the seed layer and the tungsten fill is less than that of alpha phase tungsten without the silicon-doped tungsten seed layer deposited under similar processing conditions.

In Example 17, the subject matter of any one or more of Examples 13-16 wherein a resistivity of the tungsten fill material is 2-4 Ω/sq for a recess of about 10-20 nm wide and between 50-100 nm in depth.

In Example 18, the subject matter of any one or more of Examples 13-17 wherein the first dielectric level is a nitride, the second dielectric level is an oxide, and the recesses terminate at the nitride.

Example 19 is a memory device, comprising: an oxide level comprising recesses; a silicon-containing tungsten seed layer disposed in the recesses; and a tungsten fill material disposed in the recesses on the silicon-containing tungsten seed layer, an upper surface of the tungsten fill material in the recesses planar with an upper surface of the oxide level outside the recesses, the silicon-containing tungsten seed layer disposed between the tungsten fill material and the oxide level, the majority of the tungsten fill material having a grain size of about 30-50 nm.

In Example 20, the subject matter of Example 19 wherein the recesses extend along a length of the memory device to form word lines or bit lines of the memory.

In Example 21, the subject matter of any one or more of Examples 19-20 wherein an amount of the silicon in the silicon-containing tungsten seed layer is between about 4-28% by atomic weight.

In Example 22, the subject matter of any one or more of Examples 19-21 wherein the silicon-doped tungsten film is formed from a mixture of alpha and beta phase tungsten, the silicon-doped tungsten film containing about 10-60% beta phase tungsten by atomic weight, a majority of the tungsten fill material is alpha phase tungsten, and a resistivity of the tungsten fill material is 2-4 Ω/sq for a recess of about 20 nm wide and between 50-100 nm in depth.

Example 23 is a method of forming a semiconductor device, comprising: forming a seed layer comprising tungsten and silicon over a support surface of the semiconductor device; and forming a tungsten structure over the doped tungsten-comprising seed layer, the tungsten structure forming a conductive line in which at least 50% of the tungsten is in alpha phase; and wherein at least 50% of the tungsten has a grain size with a maximum dimension of at least about 20 nm.

In Example 24, the subject matter of Example 23 wherein forming the seed layer comprises doping tungsten with silicon.

In Example 25, the subject matter of any one or more of Examples 23-24 wherein forming the seed layer comprises depositing an alloy comprising tungsten and silicon.

In Example 26, the subject matter of Example 25 optionally includes wherein forming the seed layer comprises co-depositing silicon and tungsten by plasma vapor deposition.

In Example 27, any one or more of the structures of Examples 12-22 may be constructed through use of a method as set forth in any of Examples 1-11 or 23-26.

In Example 28 any one or more of the structures of Examples 12-22 may be incorporated into memory structures.

In Example 29 the memory structures of example 28 may be memory devices.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this description, prepositions such as "on," "over," and "under" are defined with respect to the conventional plane or surface being on the top or exposed surface of the substrate, regardless of the orientation of the substrate; and while "on" is intended to identify a direct contact of one structure with another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

We claim:

1. A semiconductor device, comprising:
   a seed layer comprising tungsten and silicon over a support structure of the semiconductor device; and
   a tungsten fill material over the seed layer, in which at least 50% of the tungsten is in alpha phase; and wherein at least 50% of the tungsten has a grain size with a maximum dimension of at least 20 nm.

2. The semiconductor device of claim 1, wherein the support structure comprises a recess defined by one or more dielectric materials, and wherein at least a portion of the seed layer and the tungsten fill material extend within the recess.

3. The semiconductor device of claim 1, wherein a majority of the tungsten in the tungsten fill material has a grain size of about 30-50 nm.

4. The semiconductor device of claim 1, wherein an amount of the silicon in the seed layer is between about 4-28% by atomic weight.

5. The semiconductor device of claim 1, wherein the tungsten of the seed layer comprises both alpha and beta phase tungsten, the seed layer containing about 10-60% beta phase tungsten by atomic weight.

6. A method of forming a conductive structure, the method comprising:
   forming a recess in a dielectric level;
   forming a seed material comprising tungsten and a nucleation-inhibiting material, wherein tungsten of the seed material comprises both alpha and beta phase tungsten; and
   depositing a tungsten fill over the seed material, wherein a majority of the tungsten of the tungsten fill has a grain size having a longest dimension of at least 30 nm.

7. The method of claim 6, wherein the nucleation-inhibiting material is selected from a group consisting essentially of Ge, Sb, C, N, O, and Si.

8. The method of claim 6, wherein the nucleation-inhibiting material is silicon and wherein the silicon in the seed material is between about 4-28% by atomic weight of the seed material.

9. The method of claim 6, wherein the seed material is about 10-60% beta phase tungsten by atomic weight.

10. The method of claim 6, wherein forming the seed material comprises doping the tungsten with silicon to form a silicon-doped tungsten seed material.

11. The method of claim 10 wherein forming the seed material comprises depositing the tungsten, and implanting the silicon into the deposited tungsten of the seed material.

12. The method of claim 6, wherein forming the seed material comprises forming alternate layers of tungsten and silicon through atomic layer deposition (ALD).

13. The method of claim 6, wherein forming the seed material comprises depositing tungsten and silicon by plasma vapor deposition.

14. The method of claim 13, wherein plasma vapor deposition is performed through use of separate tungsten and silicon targets.

15. The method of claim 13, wherein the plasma vapor deposition is performed through use of a composite tungsten and silicon target.

16. The method of claim 6, wherein forming the seed material comprises depositing silicon and tungsten simultaneously.

17. The method of claim 16, wherein the seed material is formed through chemical vapor deposition (CVD).

18. The method of claim 6, further comprising lining the recess in the dielectric level with a dielectric liner; and forming the seed material on the dielectric liner.

19. The method of claim 6, wherein the seed material is formed with a thickness of 5 to 10 nm.

20. The method of claim 6, further comprising depositing the tungsten fill at temperatures of 300° C. or greater.

* * * * *